United States Patent
Hilliger et al.

(10) Patent No.: US 6,839,220 B1
(45) Date of Patent: Jan. 4, 2005

(54) MULTI-LAYER BARRIER ALLOWING RECOVERY ANNEAL FOR FERROELECTRIC CAPACITORS

(75) Inventors: Andreas Hilliger, Kanagawa-ken (JP); Jingyu Lian, Tokyo-to (JP); Nicolas Nagel, Dresden (DE); Rainer Bruchhaus, Kanagawa-ken (JP); Stefan Gernhardt, Kanagawa-ken (JP); Uwe Wellhausen, Dresden (DE); Bum-Ki Moon, Hopewell Junction, NY (US); Karl Hornik, Kanagawa-ken (JP)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/623,461

(22) Filed: Jul. 18, 2003

(51) Int. Cl.[7] ............................................. H01G 4/06
(52) U.S. Cl. ...................................... 361/311; 361/312
(58) Field of Search ................................ 361/311, 312, 361/313; 257/295, 296, 303, 302

(56) References Cited

U.S. PATENT DOCUMENTS

| | | | | |
|---|---|---|---|---|
| 6,174,735 B1 | * | 1/2001 | Evans | 438/3 |
| 6,605,835 B2 | * | 8/2003 | Lee | 257/295 |
| 6,649,954 B2 | * | 11/2003 | Cross | 257/295 |

* cited by examiner

Primary Examiner—Anthony Dinkins
(74) Attorney, Agent, or Firm—Fish & Richardson P.C.

(57) ABSTRACT

A multi-layer barrier for a ferroelectric capacitor includes an outdiffusion barrier layer permeable to both hydrogen and oxygen. The outdiffusion barrier layer covers the ferroelectric of the capacitor. Oxygen passes through the outdiffusion barrier layer into the ferroelectric during an oxygen anneal in order to repair damage to the ferroelectric caused during etching. The outdiffusion barrier layer reduces the decomposition of the ferroelectric by blocking molecules leaving the ferroelectric during the oxygen anneal. The multi-layer barrier also includes a hydrogen barrier layer deposited on the outdiffusion barrier layer after repair of the ferroelectric by the oxygen anneal. The hydrogen barrier layer allows the multi-layer barrier to block the passage of hydrogen into the ferroelectric during back-end processes.

16 Claims, 3 Drawing Sheets

MULTI-LAYER BARRIER ALLOWING RECOVERY ANNEAL FOR FERROELECTRIC CAPACITORS

FIELD OF THE INVENTION

The present invention relates to barrier layers in ferroelectric devices.

BACKGROUND OF THE INVENTION

The ferroelectric materials in FeRAM (Ferroelectric Random Access Memory) and high K materials in DRAM are generally annealed at high temperatures (500 C or above) in oxygen ambient to recover from process damage, e.g. damage caused by the Reactive Ion Etching (RIE) of the materials. During the anneal, the ambient oxygen diffuses into the ferroelectric material and reacts at the high temperature to bring about the recovery. Usually a barrier layer (e.g. $Al_2O_3$) is deposited prior to the annealing in order to prevent the ferroelectric from decomposing at the elevated temperatures. When PZT is used as the ferroelectric, it is important that the barrier reduce the outdiffusion of the lead from the PZT.

The barrier layers of the prior art also need to prevent hydrogen from diffusing into and damaging the ferroelectric during, for example, back-end BEOL. Some examples of BEOL processes include insulator deposition, copper processing and forming gas anneal. The barrier layer can be optimized to prevent the diffusion of hydrogen into the ferroelectric, but this optimized layer will also result in a barrier against the oxygen. With less oxygen diffusing into the ferroelectric, the result is a less effective recovery anneal.

One option is to continue the recovery anneal for a longer time at a higher temperature, but this causes problems, especially for capacitors having capacitor on plug structures. Poly silicon plugs or tungsten plugs (contact plugs) are often used as vertical interconnects to connect the bottom electrode of the ferroelectric capacitor to the transistors. In ferroelectric capacitors such contact plugs form a capacitor on plug (COP) structure. In COP structures, a barrier at the top of the plug prevents oxygen from passing from the ferroelectric to the plug. If the recovery anneal proceeds for too long at a high temperature then the oxygen will pass through that barrier at the top of the plug and will oxidize the plug material causing the contact to fail.

As for the PZT, it would be desirable to have a barrier that would allow oxygen to pass into the ferroelectric during an anneal pass while also preventing the ferroelectric from decomposing due to the high temperatures of the anneal. It would additionally be desirable for the barrier to prevent hydrogen from entering and causing damage to the ferroelectric during BEOL processing.

SUMMARY OF THE INVENTION

The present invention provides a barrier that allows oxygen to pass into a ferroelectric during an anneal process while also preventing the ferroelectric from decomposing due to the high temperatures of the anneal. The barrier also prevents hydrogen from entering and causing damage to the ferroelectric during post-anneal processing.

In general terms the present invention includes a multi-layer barrier for a ferroelectric capacitor having an outdiffusion barrier layer permeable to both hydrogen and oxygen. The outdiffusion barrier layer covers the ferroelectric of the capacitor. Oxygen passes through the outdiffusion barrier layer into the ferroelectric during an oxygen anneal in order to repair damage to the ferroelectric caused during etching. The outdiffusion barrier layer reduces the decomposition of the ferroelectric by blocking molecules leaving the ferroelectric during the oxygen anneal. The multi-layer barrier also includes a hydrogen barrier layer deposited on the outdiffusion barrier layer after repair of the ferroelectric by the oxygen anneal. The hydrogen barrier layer allows the multi-layer barrier to block the passage of hydrogen into the ferroelectric during back-end processes.

The method for manufacturing the multi-layer barrier includes the steps of: depositing on the ferroelectric of the capacitor an outdiffusion barrier layer permeable to both hydrogen and oxygen; performing an oxygen anneal to repair damage to the ferroelectric; allowing oxygen to pass through the outdiffusion barrier layer to the ferroelectric while using the outdiffusion barrier layer to reduce decomposition the ferroelectric during the oxygen anneal; depositing a hydrogen barrier layer on the outdiffusion barrier layer after repair of the ferroelectric by the oxygen anneal; and using the multi-layer barrier with the deposited hydrogen barrier layer to block the passage of hydrogen into the ferroelectric during back-end processes.

BRIEF DESCRIPTION OF THE FIGURES

Further preferred features of the invention will now be described for the sake of example only with reference to the following figures, in which.

DETAILED DESCRIPTION OF THE EMBODIMENTS

Figure 1:
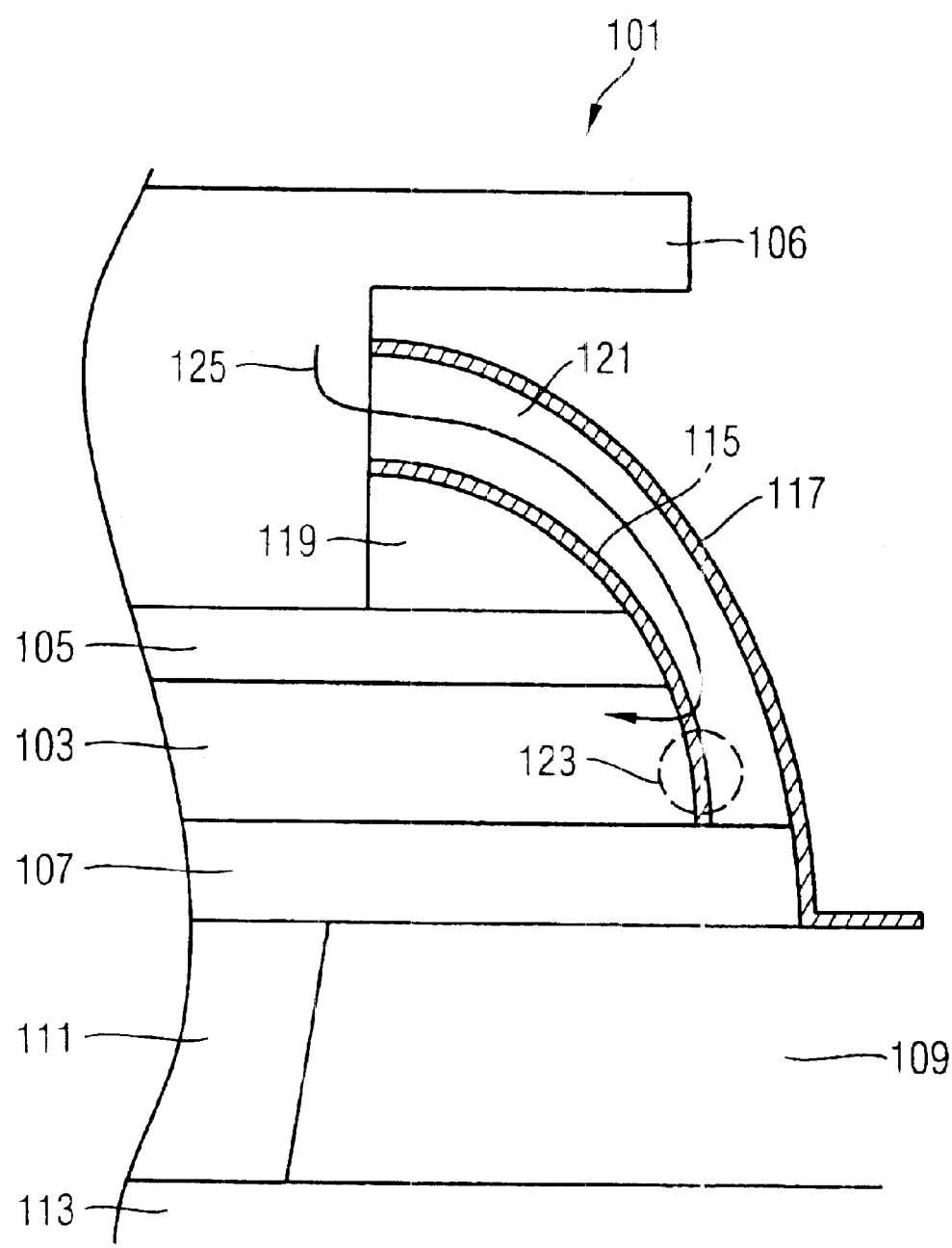
FIG. 1 shows a cut-away view of a ferroelectric capacitor with a multi-layer barrier of the present invention.

FIG. 1 shows a ferroelectric capacitor (ferrocapacitor) 101. A PZT layer 103, which in other embodiments can be other ferroelectric materials, is between a top electrode 105 and a bottom electrode 107. A metal contact 106 is electrically connected to the top electrode 105.

Supporting the bottom electrode 107 is a substructure 109, composed of TEOS, for example. Passing through the substructure 109 and electrically connecting the bottom electrode to an underlying silicon active region 113 is a contact plug 111 composed of poly silicon or Tungsten, for example.

The bottom electrode 107 can also include a barrier layer for preventing the diffusion of oxygen from the contact plug 111 into the ferroelectric layer 103.

Covering the top electrode 105 is a first TEOS hardmask 119 used for etching the top electrode 105 and ferroelectric 103. A multi-layer barrier 115 covers the hardmask 119, the top electrode 105 and the ferroelectric layer 103. The multi-layer barrier 115 is comprised of at least two layers, although additional layers can also be added. A second TEOS hardmask 121 covers the multi-layer barrier 115 and the bottom electrode 107 and is used to etch the bottom electrode 107. An outer barrier layer 117 covers the second TEOS hardmask 121. Rather than TEOS, other hardmask materials can be used to form the hardmaks 119, 121. In some embodiments the ferrocapaitor is etched using only a single hardmask, but the multi-layer barrier 115 can still be used.

Figure 2:
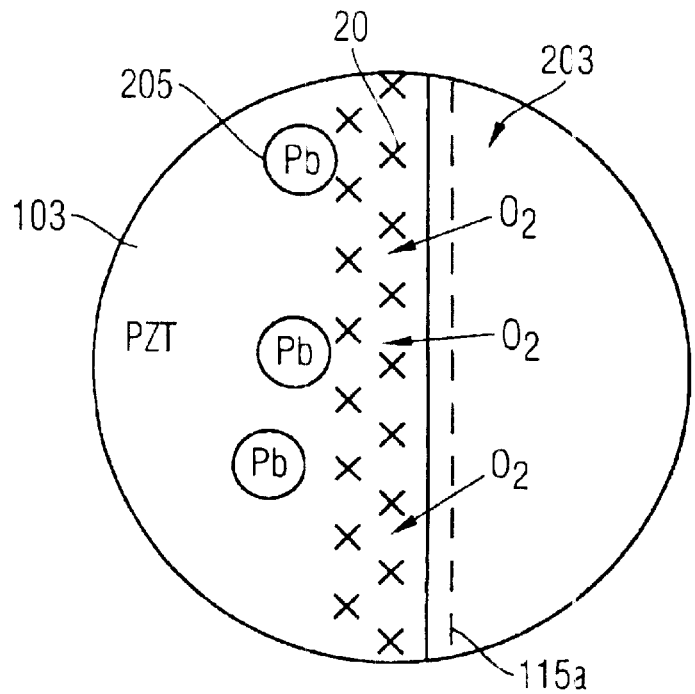
FIG. 2 shows a magnified diagrammatic view of the multi-layer barrier of the capacitor of FIG. 1 after deposition of an outdiffusion barrier layer.
Figure 3:
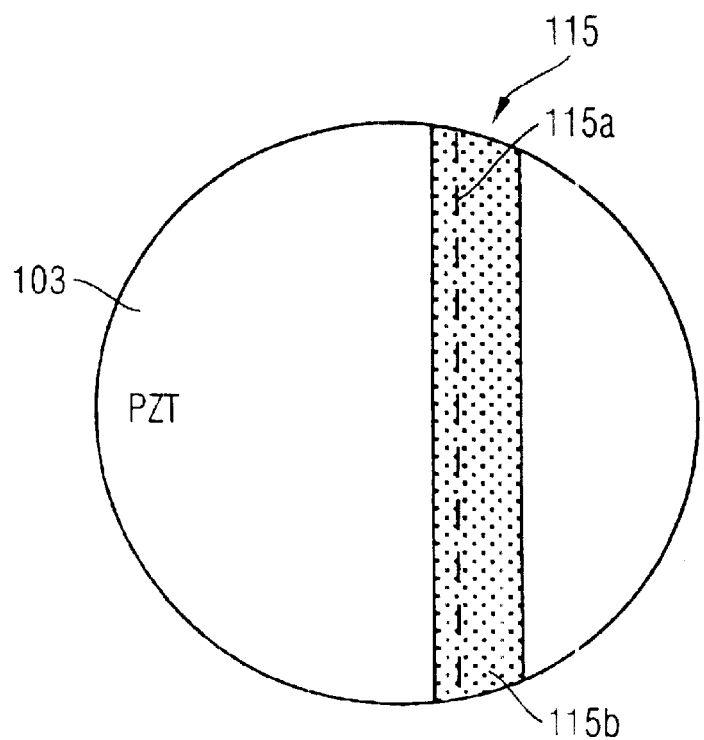
FIG. 3 shows a magnified diagrammatic view of a portion of the inventive barrier layer of the capacitor of FIG. 1 after deposition of a hydrogen barrier layer.
Figure 4:
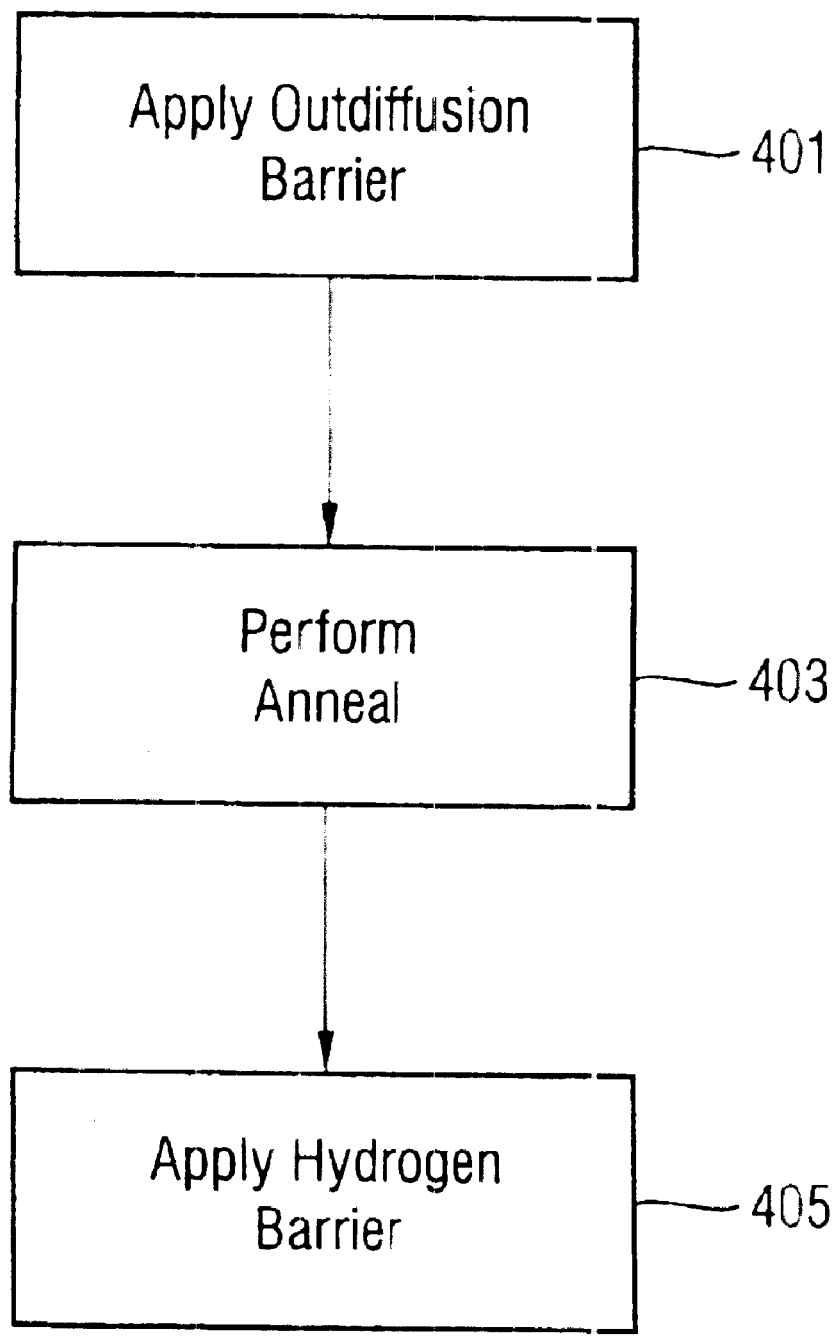
FIG. 4 is a flowchart illustrating the method for manufacturing the multi-layer barrier of FIGS. 1–3.

The method for manufacturing the multi-layer barrier 115 of FIG. 1 is described with reference to FIG. 4. Also, FIGS. 2 and 3 show diagrammatic views of a portion 123 of the multi-layer barrier 115 during the method steps.

The method includes a step 401 wherein an outdiffusion barrier layer 115a is applied to the PZT 103. FIG. 2 shows the portion 123 of the multi-layer barrier 115 after performing the step 401. The outdiffusion barrier layer 115 should be very thin (2–10 nm, for example) and can be comprised of $Al_2O_3$, for example. The outdiffusion barrier layer can be sputtered onto the PZT 103 at room temperature or at an elevated temperature.

Next an anneal step 403 is performed. The capacitor 101 is annealed at a high temperature (500 C or above) in oxygen ambient so that the PZT 103 can recover from process damage, e.g. damage caused by the Reactive Ion Etching (RIE) of the materials. Referring again to FIG. 2, the outdiffusion barrier layer 115a is shown on the surface of the PZT 103. The "X" symbols 201 diagrammatically illustrate the process damage caused to the PZT 103. During the anneal step 403, ambient oxygen 203 diffuses across the outdiffusion barrier layer 115a and into the ferroelectric to react at the high temperature and bring about the recovery. Although the outdiffusion barrier layer 115a is thin enough to allow the passage of the oxygen 203, due to the different diffusion coefficients, it is still able to serve as an outdiffusion barrier layer to reduce the outdiffusion of lead 205 from the PZT 103.

As explained above with respect to the prior art, it is important to prevent the PZT 103 from decomposing at the elevated temperatures of the anneal step 403. In the present invention, the barrier layer 115a reduces the decomposition of the PZT 103 by providing a barrier to reduce the outdiffusion of molecules from the PZT 103 while at the same time allowing oxygen 203, to pass through the barrier and into the PZT 103 to bring about the recovery of the PZT 103 through oxygen annealing. In particular, in the present invention the barrier layer 115a blocks lead (Pb) molecules 205 from leaving the PZT ferroelectric 103. The oxygen anneal step 103 is continued until the damaged PZT 103 is recrystallized.

In embodiments where ferroelectrics other than PZT are used, the barrier layer 115a can be optimized to prevent molecules other than Pb from leaving the ferroelectric and can allow molecules other than oxygen to enter the ferroelectric.

After completion of the anneal step 403 (see FIG. 4), a hydrogen barrier layer 115b is applied (using sputtering or ALD at room or elevated temperature, for example) over the outdiffusion barrier layer 115a to form the multi-layer barrier 115 (see FIG. 3). The hydrogen barrier layer 115b can be thicker than the outdiffusion barrier layer 115a (approximately 10–40 nm thick) and can also be comprised of $Al_2O_3$. The thickness and relatively perfect structure of the hydrogen barrier layer 115b make it a good hydrogen barrier.

As explained above with respect to the prior art, it is important to prevent hydrogen from diffusing into and damaging the PZT 103 or other ferroelectrics during, for example, back-end BEOL processes. A path 125 for undesirable hydrogen from the metal contact 106 through the second TEOS hardmask 121 and into the ferroelectric 103 is shown in FIG. 1. The outdiffusion barrier layer 115a is both hydrogen and oxygen permeable, allowing undesirable hydrogen, as well as the desired oxygen, to diffuse into the PZT 103. However, the hydrogen barrier layer 115b, once applied, substantially prevents hydrogen molecules from passing through the multi-layer barrier 115 and into the PZT layer 103.

Still other materials and method steps can be added or substituted for those above. Thus, although the invention has been described above using particular embodiments, many variations are possible within the scope of the claims, as will be clear to a skilled reader.

We claim:

1. A multi-layer barrier for a ferroelectric capacitor comprising:
   an outdiffusion barrier layer permeable to both hydrogen and oxygen and covering the ferroelectric of the capacitor, the outdiffusion barrier layer allowing oxygen to pass through it into the ferroelectric during an oxygen anneal to repair damage to the ferroelectric, the outdiffusion barrier layer reducing the decomposition of the ferroelectric by blocking molecules leaving the ferroelectric during the oxygen anneal; and
   a hydrogen barrier layer deposited on the outdiffusion barrier layer after repair of the ferroelectric by the oxygen anneal, the hydrogen barrier layer causing the multi-layer barrier to block the passage of hydrogen into the ferroelectric during back-end processes.

2. The multi-layer barrier of claim 1, wherein the outdiffusion barrier layer is comprised of $Al_2O_3$.

3. The multi-layer barrier of claim 1, wherein the hydrogen barrier layer is comprised of $Al_2O_3$.

4. The multi-layer barrier of claim 1, wherein the hydrogen barrier layer is thicker then the outdiffusion barrier layer.

5. The multi-layer barrier of claim 1, wherein the ferroelectric includes PZT.

6. The multi-layer barrier of claim 1, wherein the oxygen anneal is performed at a temperature of at least approximately 500 C.

7. The multi-layer barrier of claim 1, wherein the outdiffusion barrier layer reduces the decomposition of the ferroelectric by blocking lead molecules from leaving the ferroelectric during the oxygen anneal.

8. The multi-layer barrier of claim 1, wherein the outdiffusion barrier layer reduces the decomposition of the ferroelectric by blocking lead molecules from leaving the ferroelectric during the oxygen anneal.

9. The multi-layer barrier of claim 1, wherein the outdiffusion barrier layer is deposited by sputtering.

10. The multi-layer barrier of claim 1, wherein the hydrogen barrier layer is deposited using sputtering or atomic layer deposition.

11. A method for manufacturing a multi-layer barrier for a ferroelectric capacitor comprising the steps of:
    depositing on the ferroelectric of the capacitor an outdiffusion barrier layer permeable to both hydrogen and oxygen;
    performing an oxygen anneal to repair damage to the ferroelectric;
    allowing oxygen to pass through the outdiffusion barrier layer to the ferroelectric while using the outdiffusion barrier layer to reduce decomposition the ferroelectric during the oxygen anneal;
    depositing a hydrogen barrier layer on the outdiffusion barrier layer after repair of the ferroelectric by the oxygen anneal; and
    using the multi-layer barrier with the deposited hydrogen barrier layer to block the passage of hydrogen into the ferroelectric during back-end processes.

12. The method of claim 11, wherein the outdiffusion barrier layer is comprised of $Al_2O_3$.

13. The method of claim 11, wherein the hydrogen barrier layer is comprised of $Al_2O_3$.

14. The method of claim 11, wherein the hydrogen barrier layer is thicker than the outdiffusion barrier layer.

15. The method of claim 11, wherein the ferroelectric includes PZT.

16. The method of claim 11, wherein the oxygen anneal is performed at a temperature of at least approximately 500 C.

* * * * *